United States Patent [19]

Hutchinson

[11] Patent Number: 4,851,101
[45] Date of Patent: Jul. 25, 1989

[54] SPUTTER MODULE FOR MODULAR WAFER PROCESSING MACHINE

[75] Inventor: Martin A. Hutchinson, Santa Clara, Calif.

[73] Assignee: Varian Associates, Inc., Palo Alto, Calif.

[21] Appl. No.: 98,572

[22] Filed: Sep. 18, 1987

[51] Int. Cl.[4] ............................................. C23C 14/34
[52] U.S. Cl. ................................. 204/298; 204/192.12
[58] Field of Search ................ 204/192.1, 192.12, 298, 204/298 WH, 298 SC, 298 SM, 298 MC, 298 MD, 298 MB, 298 MR; 414/217, 221, 222

[56] References Cited

U.S. PATENT DOCUMENTS

| | | | |
|---|---|---|---|
| 4,405,435 | 9/1983 | Tateishi et al. | 204/298 |
| 4,548,699 | 10/1985 | Hutchinson et al. | 204/298 |
| 4,670,126 | 6/1987 | Messer et al. | 204/298 |
| 4,674,621 | 6/1987 | Takahashi | 204/298 X |
| 4,701,251 | 10/1987 | Beardow | 204/298 |
| 4,747,928 | 5/1988 | Takahashi et al. | 204/298 |

Primary Examiner—Nam X. Nguyen
Attorney, Agent, or Firm—Stanley Z. Cole; Terrence E. Dooher

[57] ABSTRACT

A sputter coating module for a multifunction processing machine is provided in which the supporting mechanism for the workpiece can be isolated from the sputtering source, the pumps and other processing apparatus for cleaning without exposing the entire machine to atmosphere. The supporting mechanism which is rotatable from the horizontal to the vertical is hollow and mounted on hollow vacuum-sealed trunnions to allow passage of water, argon, and dry-nitrogen or air at atmospheric pressure into the interior of the supporting mechanism.

10 Claims, 7 Drawing Sheets

SPUTTER MODULE FOR MODULAR WAFER PROCESSING MACHINE

FIELD OF THE INVENTION

This invention pertains to a sputter module particularly suited for use in a modular semiconductor wafer processing machine.

BACKGROUND OF THE INVENTION

In the prior art, semiconductor wafer processing machines generally performed one function only, e.g., sputter coating, etching, chemical vapor deposition etc., or performed limited multifunctions. Cassettes of wafers were carried by operators from one machine to another for different processes. This exposed the wafers to dust and gases during the transfer and required additional time for vacuum pumping at each machine.

A processing machine which could combine multiple processes in the same vacuum environment would probably have to have some mechanism for transporting wafers internally in a horizontal position between work stations. On the other hand sputter coating is best performed with the wafer in a vertical plane to avoid adherence of dust. Therefore, a sputter apparatus in a large multifunction machine would require a means for translating a wafer from a horizontal position to a vertical position for processing and back to a horizontal position.

Sputter processing machines in general have the problem that the machine inherently coats the support apparatus holding the wafer thereby creating mechanical problems and a source of dust. The support apparatus must therefore be periodically cleaned. In most prior art machines, the entire machine must be exposed to the atmosphere during cleaning thereby creating problems of contaminating the sputter source.

OBJECTS OF THE INVENTION

It is an object of the invention to provide a wafer processing machine in which a broad range of modular units for different processes may be assembled around a single vacuum environment.

It is another object of the invention to devise a sputter module into which the wafer can be inserted in a horizontal position but coated in a vertical position.

It is a further object of the invention to devise a sputter module suitable for use in a modular semiconductor wafer processing machine in which the sputter module can be isolated in vacuum from the main system while cleaning wafer support apparatus.

SUMMARY OF THE INVENTION

These objects of the invention and other objects, features and advantages to become apparent as the specification progresses are accomplished by the invention according to which, briefly stated, a sputter module has a wafer holding and heating apparatus which receives the wafer in a horizontal plane and then pivots to face the sputter source in a vertical plane. A valve is used to isolate the sputter module from the remainder of the system. The heater is located outside the vacuum environment to avoid contamination.

These and further constructional and operational characteristics of the invention will be more evident from the detailed description given hereinafter with reference to the figures of the accompanying drawings which illustrate preferred embodiments and alternatives by way of non-limiting examples

Glossary

The following is a glossary of terms, elements, and structural members as referenced and employed in the present invention.

| | |
|---|---|
| 1 | modular processing system |
| 10a–h | valve modules |
| 20a,b | transfer modules |
| 21a–d | ports of module 20a |
| 21e–g | ports of module 20b |
| 23a | interior of transfer module 20a |
| 23b | interior of transfer module 20b |
| 30b–g | process chambers |
| 31b | interior of module 30b etc. |
| 40a | entry wafer handler and loadlock module |
| 40b | exit wafer handler and loadlock module |
| 50a | flat aligner |
| 61 | standard communication bus |
| 100a–f | gate valves |
| 200a,b | transfer modules |
| 201a,b | transfer arm |
| 210 | entry/exit port |
| 211,212 | process port |
| 213 | transfer port |
| 215 | chamber of module 200a |
| 296 | circular bottom of module 200 |
| 297 | cylindrical wall of module 200 |
| 298 | circular top of module 200 |
| 299a | housing extension |
| 300a–d | process modules |
| 301a | chamber of process module 300a |
| 400 | handler and loadlock module |
| 401–404 | wafer cassettes |
| 405 | wafer handler |
| 406 | loadlock chamber |
| 407 | region of module 400 |
| 408 | wafer aligner and flat finder |
| 409 | thin film monitor |
| 500 | pass-through module |
| 501 | flat aligner |
| 600 | sputter module |
| 602 | gate valve |
| 604 | transfer module |
| 606 | vacuum-tight housing |
| 608 | support frame |
| 610 | cryopump main body |
| 612 | cryopump expander |
| 614 | sealing flange |

-continued

| | | |
|---|---|---|
| 616 | pneumatic drive | |
| 618 | sputter source | |
| 620 | shutter | |
| 630 | wafer turntable | |
| 632 | wafer | |
| 634 | trunnions | |
| 636 | heater table | |
| 638 | heater element | |
| 640 | water cooling lines | |
| 642 | support flange | |
| 644 | outer insulator | |
| 646 | outer tube | |
| 648 | base plate | |
| 650 | inner volume | |
| 652 | inner insulator | |
| 654 | inner tube | |
| 656 | axial volume | |
| 660 | wafer holding clips | |
| 662 | clip ring | |
| 664 | clip rods | |
| 666 | ring shield | |
| 668 | springs | |
| 670 | outer ends of rods 664 | |
| 672 | ceramic rod | |
| 674 | pedestal | |
| 676 | pins | |
| 678 | spring | |
| 680 | outer end of rod 672 | |
| 682 | thermocouple | |
| 690 | lever | |
| 692 | pneumatic drive | |
| 694 | actuator | |
| 696,698 | drives of actuator 694 | |
| 700 | plate | |
| 702 | connector for heating gas | |
| 704 | internal channel in heater table 636 | |
| 706 | gas outlet holes | |
| 708 | groove connecting gas outlet holes 706 | |
| 712,714 | internal shields | |
| 716 | insulator shield | |
| 718 | cooling lines | |
| 720 | snap ring | |
| 722 | o-ring seal | |
| 724 | screws | |
| 726 | small shield of bent metal | |
| 730 | wafer probe | |
| 732 | air cylinder | |
| 734 | fingers of wafer probe 730 | |

DETAILED DESCRIPTION OF THE PREFERRED EMBODIMENTS

Figure 1:
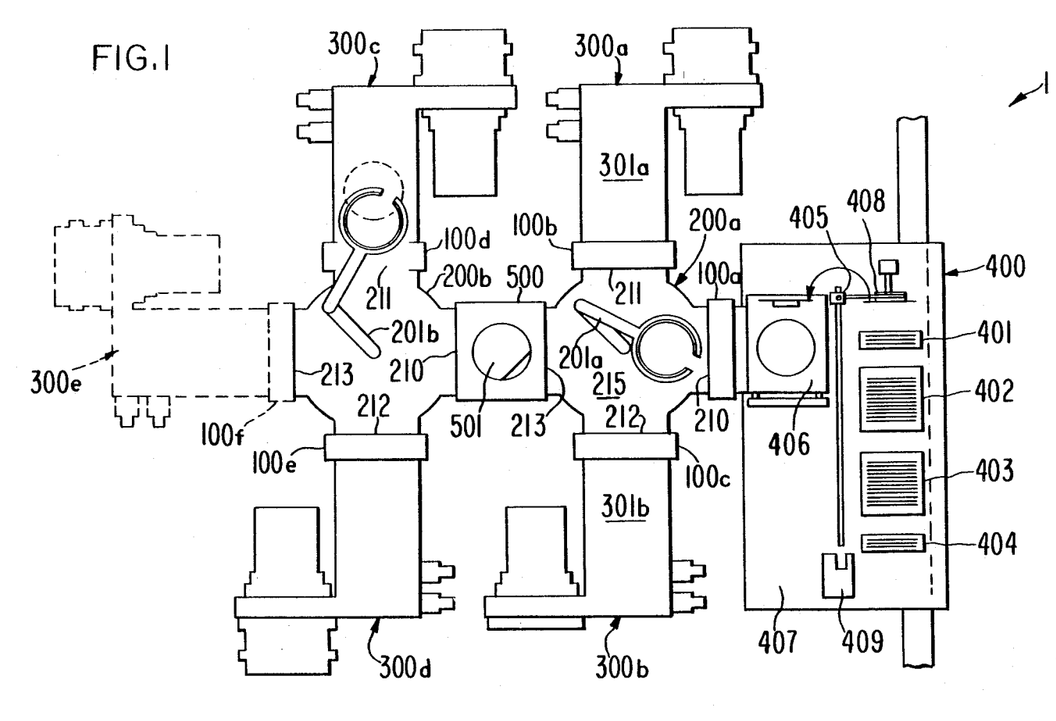
FIG. 1 is a partially schematic plan view of one embodiment of the system according to the invention.
Figure 2:
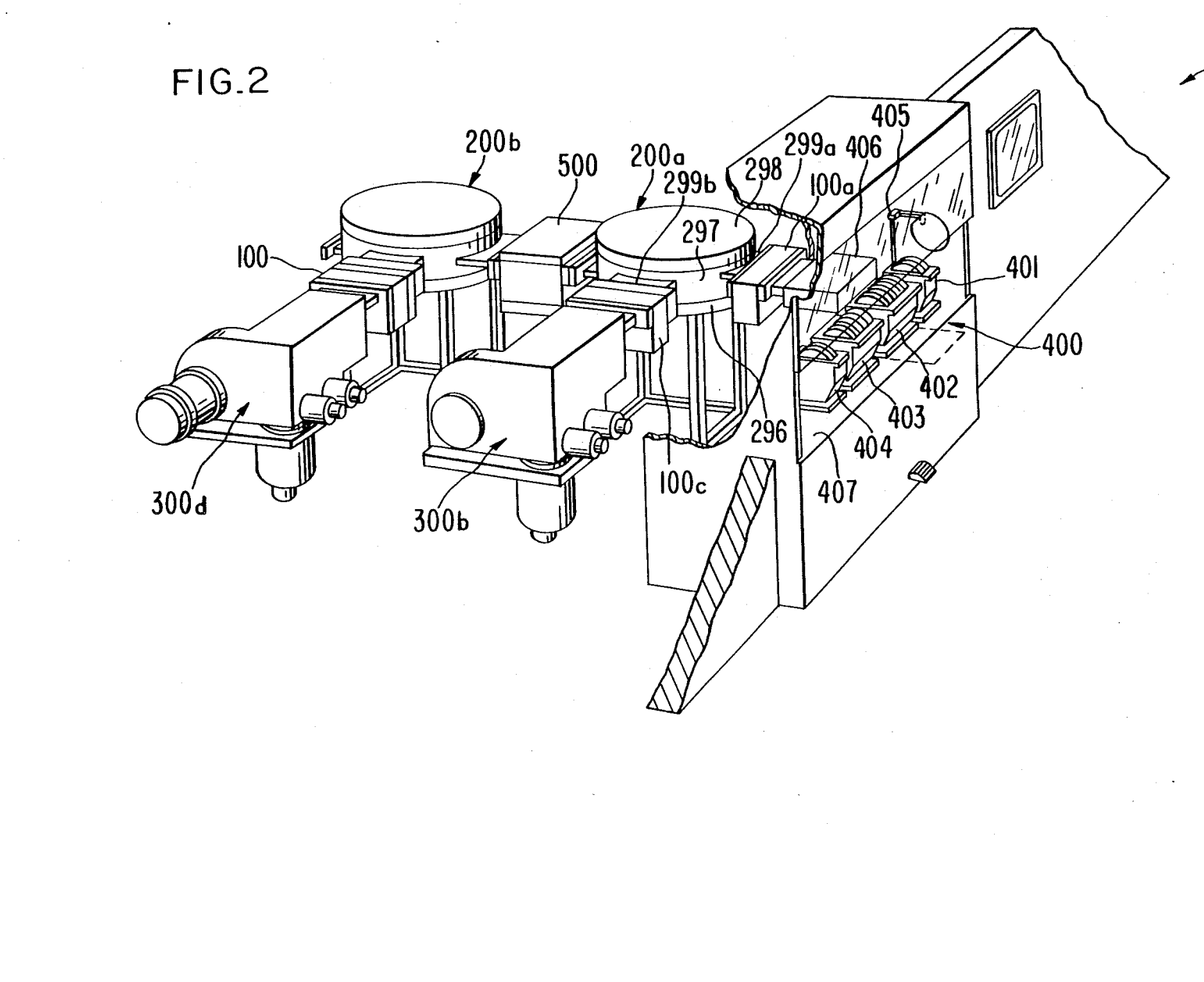
FIG. 2 shows a partial perspective view of the system shown in FIG. 1.

Referring now to the drawings wherein reference numerals are used to designate parts throughout the various figures thereof, there shown in FIG. 1 a partially schematic plan view of one embodiment of modular semiconductor wafer transport and processing system 1 of the present invention. Modular wafer processing system 1 includes wafer handler and loadlock module 400, gate valve modules 100a–100f, transfer modules 200a and 200b, process modules 300a–300d, and passthrough module 500 connected between transfer modules 200a and 200b. Wafer handler and loadlock module 400 is generally rectangular in plan view and region 407 exterior to loadlock chamber 406 and within the confines of module 400 is at atmospheric pressure. A controlled, low particulate atmosphere environment is provided in this portion of the system. In operation, a selected wafer to be processed is loaded from a selected one of semi-standard or equivalent wafer cassettes 402–403 in wafer handler and loadlock module 400 by means of wafer handler 405 which transports the selected wafer from its cassette to wafer aligner and flat finder 408 and from wafer aligner 408 to loadlock chamber 406. Wafers may also be loaded from cassette 404 which is reserved for process qualification wafers. Cassette 401 is a storage cassette allowing wafers to cool after processing before being placed in one of the other cassettes or thin film monitor 409. Wafer cassettes 401–404 are tilted at a small angle relative to the horizontal, for example, 7 degrees, so that the planar surfaces of the wafers in cassettes 401–404 are offset from the vertical by this same small angle so that the wafers are tilted to be in a known direction relative to the wafer retaining slots in the cassette when resting in their cassettes. During the transfer of a selected wafer from its cassette into loadlock chamber 406, the wafer is first moved by wafer handler 405, while maintaining the surface of the wafer in a vertical orientation, to wafer aligner 408. The selected wafer is then rotated so that the planar surfaces of the wafer are horizontal and placed in load lock 406, which is then open to the atmosphere. The planar surfaces of the wafer then remain horizontal during the transport of the wafer through gate valve module 100a into transfer module 200a by transfer arm 201a which extends through entry/exit port 210 of transfer module 200a and gate valve module 100a to withdraw the wafer in loadlock chamber 406. Transfer module 200a has four ports, 210, 211, 212 and 213. Ports 210, 211 and 212 are controlled by gate valve modules 100a, 100b and 100c, respectively. Port 211 and its corresponding gate valve module 100b connects chamber 215 of transfer module 200a with chamber 301a of process module 300a. Similarly, port 212 and corresponding gate valve module 100c connects chamber 215 of transfer module 200a with chamber 301b of processing module 300b. Interior chamber 215 of transfer module 200a is maintained at a selected pressure less than atmospheric pressure by a conventional pumping mechanism (not shown in FIG. 1). In order to increase the rate at which chamber 215 may be evacuated, chamber 215 is dimensioned relative to arm 201a to minimize the volume of chamber 215. After unloading the wafer from loadlock chamber 406, transfer arm 201a retracts into transfer chamber 215 and gate valve 100a is closed. Transfer arm 201a then rotates through a selected angle in order to present the wafer to a selected process port 211 or 212, or to transfer port 213. When a selected wafer is presented to a process port, e.g., port 211, the corresponding gate valve module, e.g., module 100b, which is closed during the transfer of the selected wafer from loadlock 406 into chamber 215 of transfer module 200a, is opened by means of a control system (not shown) Arm 201a is then extended through the process port, e.g., port 211, and the corresponding gate valve module, e.g., module 100b, into the corresponding process chamber, e.g., chamber 301a of the corresponding process module, e.g., 300a. The wafer is then off-loaded by means not shown in FIG. 1. The process modules 300a and 300b may be the same, so that the same operation is performed therein, or these modules may be different with different operations being performed therein In either case, the provision of two process modules 300a and 300b connected to transfer module 200a via ports 11 and 212 and gate valve modules 100b and 100c, respectively, together with entry/exit port 210 and valve 100a connecting transfer module 200a to wafer handler and loadlock 400 permits non-serial processing of wafers and increased throughputs compared to sequential processing systems. The time required to transfer a wafer from a wafer cassette and off-load the wafer in a selected process module is typically much less than the time required for the processing of the wafer within the process module. Thus, when a first wafer has been transferred from an input cassette into a selected one of process modules 300a and 300b, during the initial period of processing in process chamber 300a, a second wafer may be transported from loadlock chamber 406 to process module 300b. Transfer arm 201a may then rotate back to port 211 to await the completion of processing of the wafer in process module 300a. Thus, during a substantial portion of the time processing is occurring simultaneously in process modules 300a and 300b. If desired, process module 300b may be a pre-process module for sputter etch cleaning, or for deposition of a metal film by a process other than sputtering, for example chemical vapor deposition, when the main process stations are employed for sputter deposition. The wafers may then be processed in the remaining process chambers in system 1. The provision of the second entry/exit port 213 in transfer module 200a permits connection to additional process modules 300c and 300d. Transfer module 200a is connected to an identical transfer module 200b (corresponding parts bear the same numerals) via pass-through module 500. Pass-through module 500 connects entry/exit port 213 of transfer module 200a with entry/exit port 210 of transfer module 200b, thus forming a single vacuum chamber. When it is desired to transfer a wafer carried by arm 201a to one of process chambers 300c and 300d, the wafer is offloaded to a flat aligner 501 in pass-through module 500. The wafer is then on-loaded to arm 201b of transfer module 200b and transferred into the selected one of process modules 300c through 300e by arm 201b via corresponding gate valve modules 100d through 100f. When a wafer has been completely processed, it is returned from the processing module in which it resides to loadlock chamber 406 and thence to a selected cassette (401-404) via transfer arm 201a or via transfer arm 201b, pass-through chamber 501 and transfer arm 201a. Process module 300e is drawn with dashed lines to indicate that it is optional and to illustrate the capability of adding modules at will. The system shown in FIG. 1 may be expanded linearly by replacing gate valve 100f and process module 300e by a pass-through module, identical to pass-through module 500, connecting transfer module 200b with a transfer module (not shown) identical to transfer module 200b, which is in turn connected to a corresponding plurality of process chambers. The system shown in FIG. 1 may also be expanded in a non-linear fashion by replacing process module 300d by a pass-through module, identical to pass-through module 500, connecting transfer module 200b with a transfer module (not shown) identical to transfer module 200b which is connected to a corresponding plurality of process chambers. If desired, optional process module 300e may also be replaced by a second wafer handler and loadlock module identical to wafer handler and loadlock module 400. The configuration of the processing system shown in FIG. 1 permits non-serial processing, i.e., any wafer entering loadlock 406 may be transferred to a selected process chamber without passing through any other process chamber and any wafer may be transferred from a selected process chamber to any other selected process chamber or to loadlock chamber 406 without passing through any intermediate process chamber. The operation of the transfer arms, gate valves, flat aligners and loadlock chamber in system 1 are controlled by a master controller circuit (not shown). The master controller circuit is typically operated so that the gate valves are sequenced so that no given process chamber is in direct communication with another process chamber. Thus the system provides complete dynamic isolation. The non-serial processing afforded by system 1 permits continued operation of the remaining process modules when a particular process module is inoperative. The non-serial processing also permits the performance of a replacement process module or of any designated process module to be checked while the remainder of the system continues to operate. For example, if it is desired to check the performance of module 300c, a monitor wafer stored in cassette 404 may be transferred into process chamber 300c, processed and returned to cassette 404. During the processing in chamber 300c, the remainder of system 1 continues to process production wafers. FIG. 2 shows a partial perspective view of the semiconductor wafer transport and processing system shown in FIG. 1. In particular the housing of transfer module 200a is generally cylindrical in shape, and includes circular top 298, circular bottom 296 and cylindrical wall 297, joining top 298 and bottom 296. The housing may be made of any suitable vacuum compatible material, for example, stainless steel. The ports of each transfer chamber are defined by extensions of the housing which form horizontal slots extending from interior chamber 215 to the exterior of the housing. For example, port 210 (FIG. 1) is defined by housing extension 299a, shown in FIG. 2.

Figure 3:
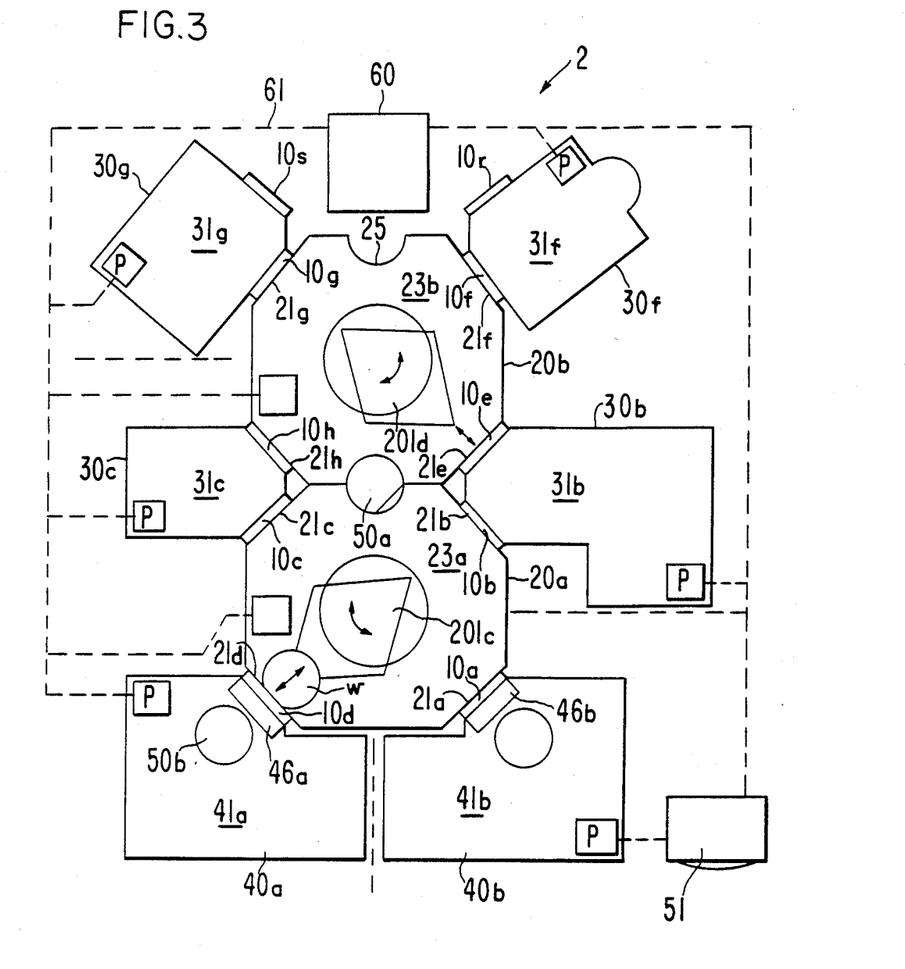
FIG. 3 shows a partially schematic plan view of a second embodiment of the system according to the invention.

FIG. 3 shows a partially schematic plan view of a second embodiment of the wafer transport and processing system of the present invention. Wafer transport and processing system 2 includes entry wafer handler and loadlock module 40a, exit wafer handler and loadlock module 40b, transfer modules 20a and 20b, gate valve modules 10a-10h, and process chambers 30b, 30c, 30f and 30g. Wafer handler and loadlock module 40a is the same as wafer handler and loadlock module 400 shown in FIG. 1. Transfer module 20a includes a vacuum chamber having ports 21a-21d for communicating the interior 23a of transfer module 20a with the exterior of module 20a. Ports 21a-21d are opened and closed by gate valve modules 10a-10d. Transfer module 20a is connected to an identical transfer module 20b via flat aligner 50a, thus forming a single vacuum chamber which is evacuated by conventional pumping means not shown in FIG. 3. Flat aligner 50a may be replaced by any suitable means for positioning a wafer in a desired rotational orientation. Transfer module 23b has four ports, 21e-21h, which are opened and closed by gate valve modules 10e-10h, respectively. The interior 31c of reactive ion etch module 30c is connected to interior chamber 23a of transfer module 20a and to interior chamber 23b of transfer module 20b via ports 21c and 21h, respectively, which are controlled by gate valve modules 10c and 10h, respectively. Similarly, the interior chamber 31b of sputter module 30b communicates with interior chambers 23a and 23b of transfer modules 20a and 20b via ports 21b and 21e, respectively, which are controlled by gate valve modules 10b and 10e, respectively. Port 21g, controlled by gate valve module 10g, connects interior chamber 23b of transfer module 20b with interior chamber 31g of chemical vapor deposition module 30g. Port 21f, controlled by gate valve module 10f, communicates interior chamber 23b of transfer module 20b with interior chamber 31f of rapid anneal module 30f. Master controller 60 communicates with each process chamber controller P and with entry module 40a and exit module 40b and operator control panel via standard communication bus 61.

In operation, a selected wafer is transported by a wafer handler (not shown in FIG. 3) from a selected wafer cassette (not shown in FIG. 3) in entry module 40a to flat finder 50b and thence to loadlock chamber 46a which is the same as loadlock chamber 406 shown in FIG. 1. Transfer arm 201c of transfer module 20a extends into loadlock chamber 46a via port 21d which is opened and closed by gate valve module 10d. The selected wafer is then on-loaded to transport arm 201c which then retracts into interior chamber 23a of transfer module 20a. Arm 201c then rotates through a selected angle to present the selected wafer to port 21c or 21b or to flat finder 50a. A wafer transferred to flat finder 50a may be on-loaded onto either transport arm 201d or onto transport arm 201c. Wafers on-loaded from flat finder 50a to transport arm 201d are then retracted by transport arm 201d into chamber 23b rotated through a suitable angle and presented to a selected port 21g or 21f. The gate valve module controlling the selected port then opens the port and transport arm 201d extends into the interior chamber of the selected process module where it is off-loaded by means not shown in FIG. 3. When flat orientation is not required for a wafer or circularly symmetric substrate, the wafer or substrate can be transferred from transport arm 201c into process chamber 31c or process chamber 31b via gate valves 10c and 10b, respectively, and from there, via gate valves 10h and 10e, respectively, directly to transport arm 201d, bypassing flat finder 50a. When a wafer has been completely processed, the wafer is on-loaded to the transport arm servicing the process module in which the wafer is located, and transferred back to exit port 21a. For a wafer in process module 30b or 30c, this is accomplished through the retraction of transport arm 201c from the process chamber, followed by a suitable rotation of transport arm 201c, which is then extended through port 21a, which is controlled by gate valve module 10a, into loadlock chamber 46b. For a wafer in process module 30g or 30f, the wafer is first transferred to transport arm 201d and from arm 201d to arm 201c via flat finder 50a. Semicircular arc 25 denotes that the system shown in FIG. 3 may be expanded by adjoining a third transfer module similar to transfer module 20b to a flat finder located at semicircular arc 25. The modules shown in the embodiment of FIG. 3 are interchangeable, allowing the system to be configured with any combination of modules that may be desired The system shown in FIG. 3 has the same advantage of non-serial processing as the system shown in FIG. 1. The system shown in FIG. 3 is somewhat more flexible in that transport arm 201d services four processing ports and transfer arm 201c services two processing ports and both an entry and exit module. If desired, entry module 41a may serve as both an entry and exit module and exit module 41b may be replaced by a process module. Similarly, if desired, any process module may be replaced by an exit module or by an entry module.

Figure 4:
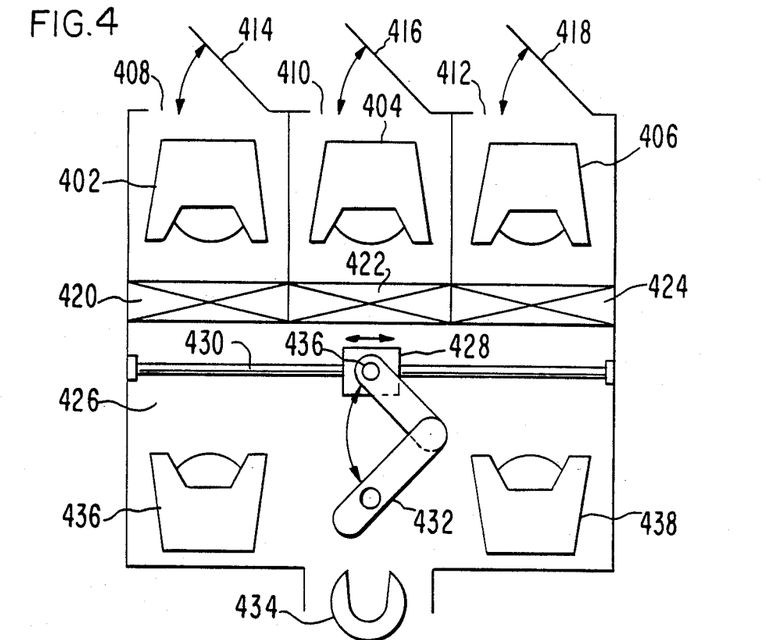
FIG. 4 shows a schematic plan view of a particularly preferred embodiment of the loadlock module according to the invention.

In an embodiment of the wafer handler and loadlock module 400 (FIG. 1) which is to be particularly preferred, three or more cassettes of wafers are loaded into the vacuum in separate loadlocks in order to facilitate high speed processing and wafer outgassing. As shown in FIG. 4, cassettes 402, 404 and 406 are shown in loadlock chambers 408, 410 and 412, respectively. The cassettes are loaded through doors 414, 416 and 418 from the clean room. These loadlock chambers are pumped from below by suitable pumping means (not shown). When suitable levels of vacuum are achieved valves 420, 422 or 424 (shown only schematically) may be opened to permit movement of the wafers from the cassette into the wafer loadlock handling chamber 426. Within the chamber 426, a handling arm driving mechanism 428 is mounted on a track 430. The handling arm driving mechanism 428 may be moved along the track 430 to align with each of the loadlock chambers 408, 410, 412. A two-piece arm 432 is mounted above and driven by the handling arm driving mechanism 428. The arm 432 is used to reach through any one of the valves 420, 422, 424 to pick up a wafer from a cassette or to return a wafer to the cassette Elevators (not shown) below the tables on which the cassettes rest are used to raise or lower the cassettes to permit the arm to reach different wafers in each cassette. The arm 432 can be used to move the wafer to a resting table 434 from which it is picked up by another wafer handling device of the system. Hot wafers picked up by the arm 432 can be moved to storage cassettes 436 or 438 to permit the wafer to cool before moving the wafer back to the cassette.

Figure 5:
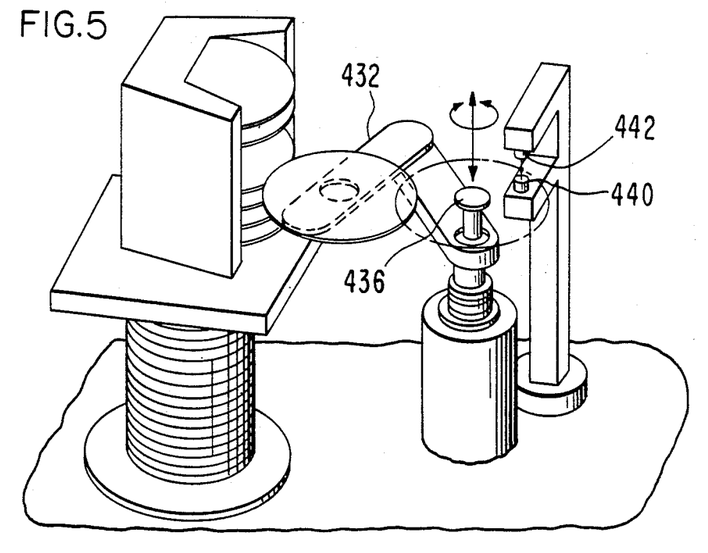
FIG. 5 shows a perspective view of the wafer handling arm and aligner of FIG. 4.

An important feature of the invention is the concentric wafer orientation device incorporated into the handling arm driving mechanism 428. A table 436 rests on a shaft (not shown) which is concentric with the shaft connecting the handling arm driving mechanism 428 to the handling arm 432. A view of this arrangement is shown in FIG. 5. A wafer is placed over the table 436 by the arm 432. The table 436 is rotated so that the wafer edge passes between light emitter 438 and light detector 440. Rotation of the edge of the wafer through the light beam provides light intensity variation information as a function of angle of rotation which permits the central computer to calculate the centroid of the wafer and the position of the flat. The computer then aligns the flat and stores the information on the true center for setting the wafer on the table 434. The wafer pass through module 500 can also use the same rotational flat alignment described above in the flat aligner 501. The rotatable table 436 receives the wafer into the module 500. The light emitter 438 and light detector 440 are used to provide light intensity information as previously described to permit aligning the wafer.

The foregoing discussion focussed on rectangular geometries for sake of simplicity of discussion. It can be seen however that the basic geometry of the transfer module can be six-sided or eight-sided, or even more complex if that is desired. For more complex geometries, the processing modules must be smaller or the transfer module must be larger.

A sputter module according to the invention is shown in greater detail in FIGS. 6-10. The sputter module 600 is attached to a gate valve 602 by means of a flange having vacuum sealing means and suitable bolts or fasteners. The opposite side of the gate valve 602 is similarly attached with a vacuum tight seal to a transfer module 604 which is similar to the transfer modules 20a or 200a. The sputter module 600 has an outer vacuum-tight -housing 606 mounted on a support frame 608. The interior of the vacuum housing 606 is pumped by a cryopump main body 610 and cryopump expander 612. The opening of the cryopump main body 610 which opens to the interior of the vacuum housing 606 can be sealed off by a sealing flange 614 mounted on a shaft driven by a pneumatic driver 616 or other suitable driving means such as a solenoid. Driver 616 could be for example a 5 inch diameter air cylinder made by Compact Air Products Inc. of Westminster SC [Model AR-5×(7/2)]A sputter source 618 such as the Varian Conmag II ™ shown in U.S. Pat. Nos. 4,569,746; 4,595,482; 4,606,806; 4,627,904; 4,657,654; 4,661,228 (all of which are commonly assigned to Varian Associates Inc. in common with this patent), all of which are hereby incorporated by reference, is mounted at the end of the vacuum housing 606 opposite to the end attached to the gate valve 602.

Figure 7:
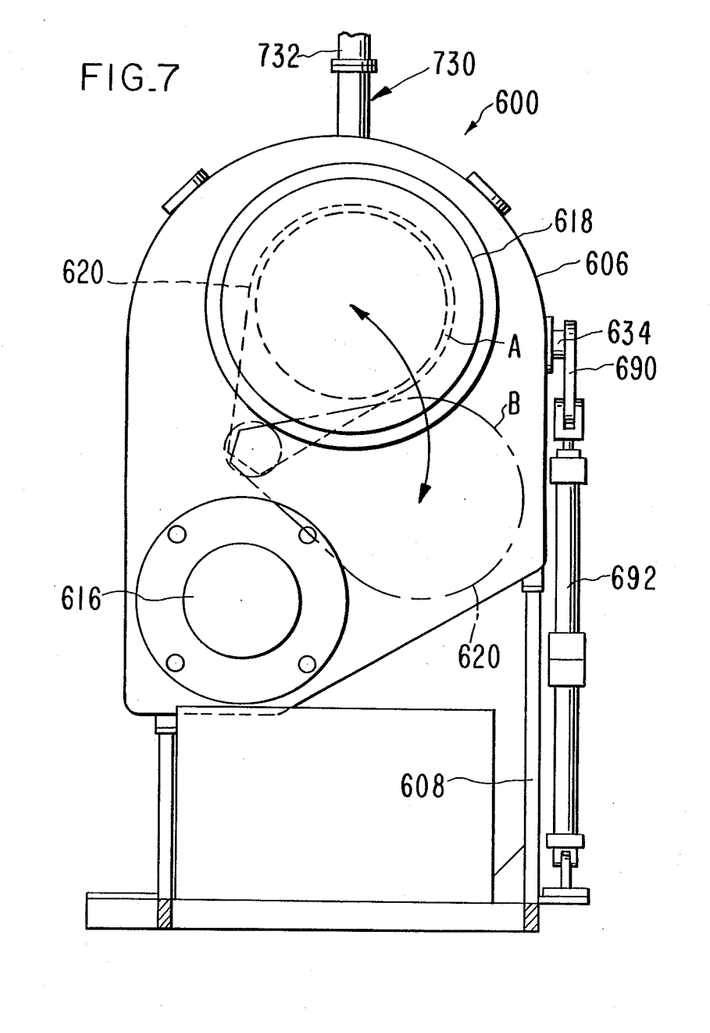
FIG. 7 is an end view of the sputter coating apparatus of FIG. 6 along the line 7—7 in FIG. 6.

A shutter 620 is shown in FIG. 7 in a closed position A and open position B. The shutter 620 is used to shield the apparatus and wafer from the sputter source while the wafer is being changed. It is undesirable to completely stop the sputter source 618 during the wafer changing operation. Rather power to the source is reduced so that the source is operating at a small fraction of normal power and the shutter 620 is closed during the changing cycle. The shutter 620 is mounted on a shaft in a rotating vacuum seal (not shown) such as Model 50-c-103-191 made by Ferrofluidics Corporation of Nashua NH and driven by a pneumatic actuator (not shown) such as Model R-11a-1-90-P-D-A-M of PHD Inc. of Fort Wayne IN.

Figure 6:
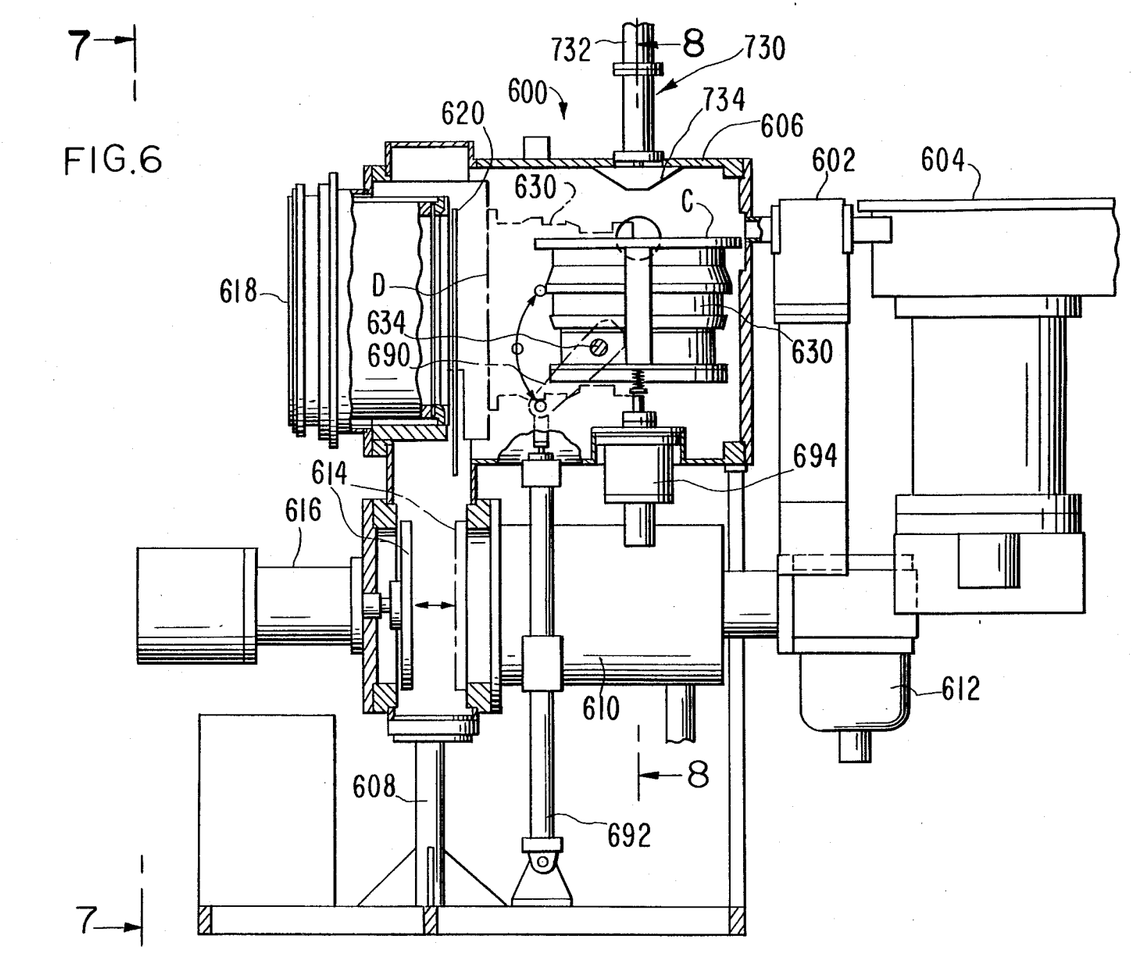
FIG. 6 is a side view of the sputter coating module according to the invention.

One important aspect of the invention is the holding and manipulation of the wafer during loading, processing and unloading. During processing it is desirable to heat the wafer from the wafer backside to achieve an optimum planarized coating. Furthermore, the wafer must be manipulated from the horizontal position in which it is received through the gate valve 602 from the transfer module 604 to a vertical position in front of the sputter source 618 and then back to the horizontal position for return to the transfer module 604. The complex requirements for heating and removing excess heat combined with the complicated motions required in holding and manipulating the wafer give rise to the wafer turntable 630.

Figure 8:
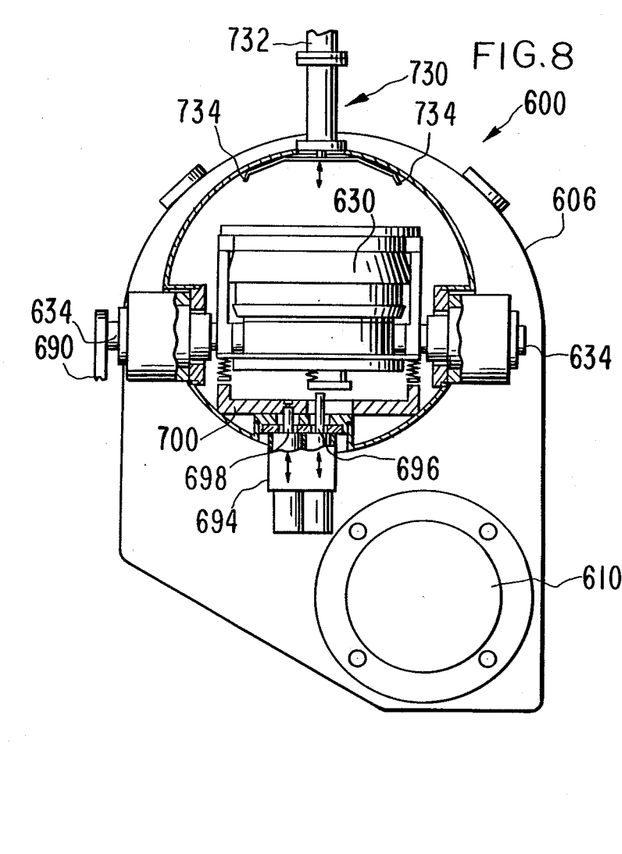
FIG. 8 is a sectional view of the sputter module of FIG. 6 as shown along the section line 8—8 in FIG. 6.
Figure 9:
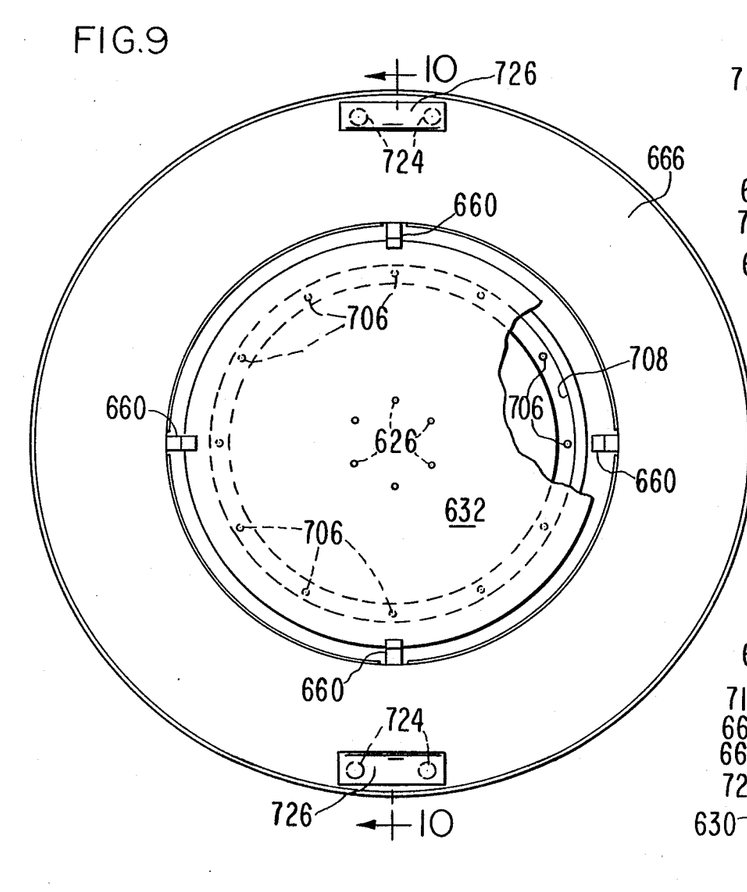
FIG. 9 is an enlarged view of the wafer turntable in the apparatus of FIG. 6 from the face of the turntable.
Figure 10:
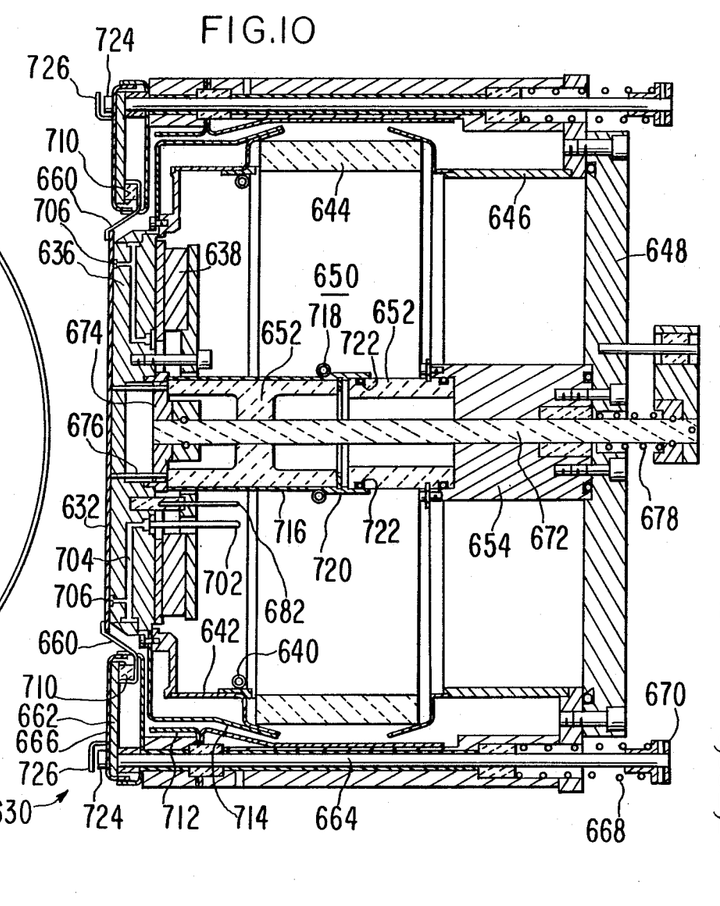
FIG. 10 is a sectional view of the wafer turntable of FIG. 9 along the section line 10—10 in FIG. 9.

The wafer turntable 630 is shown in more detail in FIGS. 9-10. The wafer 632 is placed by the manipulator arm of the transfer module 604 on the turntable 630 in the horizontal position C as shown in FIGS. 6,8. The wafer 632 is then clamped to the turntable 630 by apparatus to be described hereinafter and the turntable is rotated on a pair of trunnions 634 so that the turntable 630 with wafer 632 is now in a vertical position D, shown in FIG. 6, facing the sputter sources The gate valve 602 has been closed and the shutter 620 is opened to commence the sputtering operation. After the desired layer is deposited, the shutter 620 is closed, power to the source 618 is reduced and the turntable 630 is rotated to the horizontal position for unloading the wafer 632. The trunnions 634 include commercially available rotatable vacuum seals, such as Model 50-D10-3320 made by Ferrofluidics Corporation of Nashua NH. The trunnions 634 are hollow, having an interior diameter of about 3/2 inch, and carry cooling gas such as dry nitrogen or air to the interior of the turntable 630, as well as wires, tubing for cooling water and tubing for argon gas.

Referring now to FIGS. 9-10, the wafer 632 is shown mounted on the heater table 636 of metal which is heated from behind by heater element 638. The preferred material of the heater table and other surfaces facing the sputtering source is type 304 stainless steel. Argon or other gas suitably compatible with the sputtering process is carried through tubing through the trunnions 634 to the backside of the heater table 636, where it is injected through small channels in the heater table 636 into the small space between the wafer 632 and the face of the heater table 636. The argon gas provides heat conduction between the heater table and the backside of the wafer, as described in U.S. Pat. No. 4,512,391, which is assigned to Varian Associates Inc. in common with this patent, and which is hereby incorporated by reference.

Water cooling lines 640 are attached to a support flange 642 supporting the outer periphery of the heater table 636. The support flange 642 is sealed to an outer insulator 644 which is in turn sealed to an outer tube 646. The preferable material of this and other insulators to be specified is $Al_2O_3$ for its ability to withstand heat and RF in a vacuum environment. The outer tube 646 is in turn sealed to a base plate 648. The heater table 636, support flange 642, outer insulator 644, outer tube 646 and base plate 648, all together, form a sealed container defining inner volume 650. Within the inner volume 650, an inner insulator 652 is sealed at one end to the back face of heater table 636. The opposite end of the inner insulator 652 is sealed to one end of an inner tube 654. The opposite end of the inner tube 654 is sealed to the base plate 648. The inner insulator 652 and the inner tube 654 are partially hollowed and surround an axial volume 656.

The outer insulator 644 and the inner insulator 652 provide both electrical and thermal insulation between the heater table 636 and the remainder of the sputtering module 600. This enables the heater table 636 to be efficiently heated without heating the whole apparatus, and for the wafer to be biased with DC and RF voltages as are suitable to the process.

An important aspect to understanding how the apparatus according to the invention solves the conflicting requirements for heat handling and motions requires an explanation of the pressure regimes within the turntable apparatus. The waste heat which escapes from the heater element 638 is not entirely dissipated through the water cooling lines 640. The inner volume 650 is kept at atmospheric pressure and is cooled with dry nitrogen or air which passes through the hollow centers of the trunnions 634. The volume 650 is a toroid in shape since the inner insulator 652 and inner tube 654 are sealed to the heater table 636 and base plate 648, thereby separating the axial volume 656 from the inner volume 650. The axial volume 656 is connected by various passageways to the vacuum environment inside the vacuum tight housing 606. Thus, there is external atmospheric pressure surrounding the vacuum environment inside the housing 606, which surrounds the inner volume 650 at atmospheric pressure, which surrounds the axial volume 656 at vacuum.

Wafer holding clips 660, three or more in number are supported on a clip ring 662 which is attached to clip rods 664, two or more in number. The clip ring is protected from sputtered material by a ring shield 666. The rods 664 are biased by springs 668 so that without external forces the wafer is held by the clips to the heater table 636. When an external force is applied to the outer ends 670 of the clip rods 664, the clip ring 662 is raised, thereby raising the clip 660 and releasing the wafer. A ceramic rod 672 in the center of the axial volume 656 is attached to a pedestal 674 behind the heater table 636. A number of pins 676, at least three but optimally six, are mounted on the pedestal 674 and pass through holes on the heater table 636. The pins 676 are small and are spaced to avoid contact with the heater element 638. The ceramic rod 672 is biased by spring 678 so that in the absence of exterior forces, the pins 676 are withdrawn entirely into the heater table 636. When the ceramic rod 672 is pushed from its outer end 680, the pins 676 rise to push the wafer 632 away from the heater table, thereby making room for the manipulator arm from the transfer module 604 to slip beneath the wafer. The heater table also has implanted in it a thermocouple 682 to monitor and control the temperature.

As shown in FIG. 6, trunnion 634 is attached to lever 690, which is driven by pneumatic drive 692 to rotate the wafer turntable 630. Pneumatic drive 692 could be for example an air cylinder of 6 inch stroke made by PHD Corporation of Fort Wayne IN (Model Tom Thumb TDK-[11 /8]×6-x-m). Actuator 694 includes two pneumatic drivers 696,698, each of which is a Model AS-[9/8]×[5/4] made by Compact Air Products of Westminster SC. Actuator 694, in principle, could be either electromagnetically or pneumatically operated. However, it is desirable that the action be slow and smooth. Thus, in a particularly preferred embodiment the actuator is pneumatically driven, or in the alternative, electrically driven with fluidic damping. Driver 696 pushes on the outer end 680 of the ceramic rod 672, and driver 698 pushes on a plate 700 which in turn pushes on the outer ends 670 of all of the clip rods 664.

Actuator 694 thereby controls the releasing and raising of the wafer to enable the manipulator arm to remove the wafer while the surface of the turntable 630 is in the horizontal position. After the turntable is loaded with a new wafer but before the turntable is rotated, the drivers 696,698 of the actuator 694 are withdrawn and the springs 668 are permitted to bias the clips 660 to hold the wafer.

An inert heating gas, such as argon, is conveyed via tubing to a connector 702 at the rear of the heater table 636, as is shown in FIG. 10. The heating gas is conveyed through interior channels 704, to outlet holes 706 in the face of the heater table 636. In a preferred embodiment, there are about 12 outlet holes 706 located near the outer diameter of the heater table 636. The outlet holes 706 are interconnected with a groove 708, shown in FIG. 9.

The clips 660 are mounted on a ceramic ring 710 in order to keep the clips 660 from shorting the bias potential to ground. Various shields, such as ring shield 666, are used to keep sputtered materials from the sputter source 618 from sputtering on surfaces which are difficult to clean such as ceramic ring 710.

Unwanted sputtering and sputter etching can also take place between internal parts due to differences in potential and the high operating temperature. Internal shields 712, 714 reduce the impact of unwanted sputtering between the support flange 642 and the clip rods 664. An insulator shield 716 sheaths the inner insulator 652. Cooling lines 718 are used to cool the shield 716 and thereby keep the inner insulator 652 at a reasonable operating temperature and shielded from the heater element 638. The inner insulator 652 is made in two pieces, one piece being sheathed with the shield 716 and the other not sheathed, the pieces being held together with a snap ring 720 and vacuum-sealed with o-ring 722. The ring shield 666 is held by screws 724 which is bent a small shield 726 to keep from the slots of the screws 724.

At the top of the housing 606 centered over the wafer in the horizontal position, there is mounted a wafer probe 630. The wafer probe 630 aids in disengaging the wafer 632 from the clips 660 after sputtering. A three inch stroke air cylinder 732 made by Compact Air Products Inc. of Westminster SC (Model AR-(9/8)×3) is used to lower the tip of the probe 630 to within 0.050 inch of the surface of the wafer 632 before the clips 660 are raised. If the wafer 632 is joined to the clips 660 by the sputtered material, raising the clips 660 will raise the wafer 632 until the wafer 632 strikes the tip of the probe 730 and is knocked off. The tip of the probe 730 can be made of 304 stainless steel in the form of a plurality of blunt fingers 734 which strike the surface of the wafer only at the outer perimeter of the wafer, which is expendable.

This invention uses a wafer holding turntable as described heretofore which is at atmospheric pressure inside except for the very center which is in vacuum as is the outer surface of the turntable. This allows the heating element, thermocouple, water cooling, wires and argon gas plumbing to be at atmospheric pressure, which facilitates gas cooling. However, the turntable does not require moving bellows to seal the pedestal mechanism for the lifting pins. Since the heating element is at atmospheric pressure, the heater element can be an inexpensive electric stove type heater with standard electrical connections. Also the heater element can be covered on one side with fiber insulation since it is not in vacuum to aid in concentrating the heat at the heater table. The thermocouple on the backside of the heater table is also at atmospheric pressure and this helps to make the temperature measurement more accurate since there is good gas heat conduction between the heater table and the thermocouple.

This invention is not limited to the preferred embodiment and alternatives heretofore described, to which variations and improvements may be made including mechanically and electrically equivalent modifications to component parts, without departing from the scope of protection of the present patent and true spirit of the invention, the characteristics of which are summarized in the following claims.

What is claimed is:

1. A sputter deposition apparatus comprising:
  chamber means for holding a vacuum environment when connected to a vacuum pump, said chamber means having a port for receiving a wafer;
  means for sputter coating a wafer, said means for sputter coating being located in said chamber means;
  means for supporting a wafer;
  means for holding a wafer against said means for supporting;
  means, attached to said means for supporting, for heating said means for supporting; and
  means for rotating said means for supporting and said means for heating from a first position wherein a surface of said means for supporting is substantially horizontal for receiving a wafer oriented horizontally to a second position wherein said surface is substantially vertical so that a wafer held against said surface by said means for holding is positioned substantially vertically opposite said means for sputter coating.

2. A sputter deposition apparatus as in claim 1 wherein said means for supporting includes an interior chamber, the interior of which is not in said vacuum environment, said means for supporting being mounted on means for conveying gas to said interior chamber.

3. A sputter deposition apparatus as in claim 2 wherein said means for supporting includes clips for holding a wafer at points near the perimeter of the wafer and a spring-biased mechanism for forcing said clips against the wafer.

4. A sputter deposition apparatus as in claim 3 wherein said means for supporting includes means for lifting a wafer from said surface.

5. A sputter deposition apparatus as in claim 4 wherein said interior chamber of said means for supporting surrounds said means for lifting, said means for lifting being in said vacuum environment.

6. A sputter deposition apparatus as in claim 5 further including means for closing said port so that a vacuum seal is formed between said chamber means for holding a vacuum environment and a transfer module of a multi-function wafer processing apparatus.

7. A sputter deposition apparatus as in claim 2 further including a thermocouple attached to said means for supporting and exposed to the interior of said interior chamber.

8. A sputter deposition apparatus as in claim 1 further including means attached to said chamber means and extendable into said chamber means for disengaging a wafer from said means for holding by contacting a peripheral region of the wafer.

9. A sputter deposition apparatus as in claim 1 wherein said means for supporting includes channels for conveying a gas to outlet holes in said surface, said channels passing through said means for rotating.

10. A sputter deposition apparatus comprising:

a vacuum chamber for holding a vacuum environment when connected to a vacuum pump, said vacuum chamber having a port for receiving a wafer;

a sputter coating source, said sputter coating source being located in said vacuum chamber;

a turntable for receiving a wafer in a horizontal plane on a front face from an arm extended through a port into said vacuum chamber, said turntable being located inside said vacuum chamber, said turntable having vacuum-tight walls defining an interior volume not in said vacuum environment and said turntable being mounted on trunnions which are capable of conveying gas to said interior volume of said turntable from a source exterior to said vacuum chamber, said turntable including lifting pins for lifting a wafer from said front face and sealing means for forming a vacuum tight-seal between said interior volume and said lifting pins, said lifting pins operating in the vacuum environment;

a clamping apparatus for holding a substrate to said turntable;

a heater for heating said front face of said turntable, said heater being attached to said turntable; and a mechanism for rotating said turntable, said clamping apparatus and said heater through a right angle about an axis so that said wafer is positioned substantially vertically opposite said sputter coating source.

* * * * *

UNITED STATES PATENT AND TRADEMARK OFFICE
CERTIFICATE OF CORRECTION

PATENT NO. : 4,851,101
DATED : July 25, 1989
INVENTOR(S) : Hutchinson

It is certified that error appears in the above-identified patent and that said Letters Patent is hereby corrected as shown below:

In column 4, line 60, delete "11" and insert therefore --211--.

In column 11, line 62, before "which" insert --over--.

In column 11, line 63, after "from" insert --clogging--.

Signed and Sealed this

Thirty-first Day of July, 1990

Attest:

HARRY F. MANBECK, JR.

*Attesting Officer*  *Commissioner of Patents and Trademarks*